United States Patent [19]

Lewis, Jr. et al.

[11] 4,242,713
[45] Dec. 30, 1980

[54] TRIAC OUTPUT ASYMMETRY DETECTOR

[76] Inventors: Raymond H. Lewis, Jr., 717 N. "K" St., Lake Worth, Fla. 33460; Edward W. Goodrich, 222 Caribbean Rd., Palm Beach, Fla. 33480; Dale W. Kline, 3851 Buttercup Cir., Palm Beach Gardens, Fla. 33410

[21] Appl. No.: 84,924

[22] Filed: Oct. 25, 1979

[51] Int. Cl.³ .............................................. H02H 3/26
[52] U.S. Cl. .................................... 361/86; 340/645; 361/104; 361/112
[58] Field of Search ..................... 361/85, 86, 88, 100, 361/112, 104; 340/645, 653, 661; 307/252 T, 252 B, 358; 328/114, 135; 323/24, 34, 36; 219/108, 110, 114, 501

[56] References Cited

U.S. PATENT DOCUMENTS

| | | | |
|---|---|---|---|
| 2,151,753 | 3/1939 | Etzrodt | 361/112 X |
| 2,394,084 | 2/1946 | Livingston | 361/112 |
| 2,438,742 | 3/1948 | Farrow | 340/645 X |
| 2,774,940 | 12/1956 | Bernet | 324/102 |
| 3,302,064 | 1/1967 | Redmond | 361/112 |
| 3,486,073 | 12/1969 | Eriksson et al. | 361/17 |
| 3,515,896 | 6/1970 | Swing et al. | 307/64 |
| 3,532,900 | 10/1970 | Rhyne, Jr. | 307/252 T |
| 3,644,783 | 2/1972 | Snyder | 315/127 |
| 3,660,720 | 5/1972 | Samm et al. | 361/57 |
| 3,686,511 | 8/1972 | Pauly | 307/202 |
| 3,693,047 | 9/1972 | Hamstra | 361/24 |
| 3,717,793 | 2/1973 | Peterson | 361/104 |
| 3,794,811 | 2/1974 | Hehl | 219/501 |
| 3,857,083 | 12/1974 | Lundstrom | 321/14 |
| 3,936,702 | 2/1976 | Plasko | 361/104 |
| 4,038,584 | 7/1977 | Tarchalski et al. | 361/104 |

FOREIGN PATENT DOCUMENTS

46-35104 10/1971 Japan .................................... 340/645

Primary Examiner—Harry E. Moose, Jr.
Attorney, Agent, or Firm—Barry L. Haley; Eugene F. Malin; Philip R. Wadsworth

[57] ABSTRACT

A circuit for protecting an AC driven load that is controlled by a solid state device, such as a triac, or inverse SCR's, or the like. Whenever the AC power output of the control is asymmetrical to the load, the circuit produces a signal capable of shutting down the AC power to the load, sounding an alarm, switching to a different controller, or signaling another load protecting reaction. The protection circuit continuously measures each individual half cycle of the AC output from the controller to the load and provides for phase shifting about a reference point, resulting in summing (or nulling) of the AC output half waves (positive and negative) at the reference point. The summing (or nulling) reference point is coupled to the gate of a switching element connected across the AC input line, the switching element being responsive to a positive or negative voltage above a predetermined threshold value. Half wave failure of the load controller resulting in an asymmetrical power output from the controller to the load creates a net charge, positive or negative (at the reference point). Whenever the net voltage at the reference point reaches the threshold voltage of the response switch, the load protecting response switch will be triggered.

6 Claims, 21 Drawing Figures

FIG.13a NORMAL

FIG.13b MISSING NEGATIVE 1/2 WAVE FAULT

FIG.13c MISSING POSITIVE 1/2 WAVE FAULT

FIG.19

TRIAC OUTPUT ASYMMETRY DETECTOR

BACKGROUND OF THE INVENTION

This invention relates generally to an AC load protection circuit for use with an AC driven load that is controlled by a semiconductor or solid state controller, and specifically to a circuit that protects against asymmetric input to the load resulting from a failure of the load controller which may damage the load, and/or result in a safety hazard to the load and the load environment.

It is a well known practice to utilize on/off or proportional controllers with AC inductive loads such as motors and the like as well as with various resistive loads. The use of solid state controllers has, however, been limited because of problems which would occur should the control element fail, resulting in a rectified (DC) current to an inductive load which can cause overheating and damage to the load. Thus, in many applications, utilizing such an inductive load, solid state devices such as the triac or silicon-controlled rectifier have not been used because, should such an element fail, it is possible that the inductive load could receive a rectified current, resulting in fire or other damage. In fact, the most probable failure of such a device is a half wave conduction. Thermal overload protection devices, which may be incorporated into the load itself to protect the equipment from overheating, are generally not sufficient to protect the load equipment from such an asymmetrical power input failure because the thermal switching device, after a number of openings and closures, are often welded together by the pulsing DC rectified current, rendering them ineffective. A typical failure of a solid state control element would be an asymmetrical output to the load resulting in a pulsating DC current reaching the load.

Present day devices capable of showing the wave form output of the control element, and thus displaying a half wave output are totally unsuited and impractical for use as a safety device. For example, a CRT can be used to display AC wave forms and could show a half wave effect from a central element. However, such devices are impractical because of their size, the extreme cost involved, and their power requirements.

The present invention allows for the safe use of a solid state control element by providing a protection circuit that is employed in conjunction with the solid state load controller coupled to an AC load (both proportional or full on/off control) that prevents load damage in spite of controller failure. The present invention is also suitable for multiple applications because of its greatly reduced size, its cost effectiveness, extremely low power requirements, and its capability of being positioned within the overall system at a remote location from the load. This allows for the possibility of multiple sensing operations. The present device can also be used in various frequency environments (frequency of the AC input power) when the circuit elements are properly proportioned. The use of the present invention as a safety device is also not necessarily limited to inductive loads, but may be used for inductive-resistive, resistive loads alone, or reactive loads.

BRIEF DESCRIPTION OF THE INVENTION

A circuit for protecting one or more AC driven inductive or resistive loads controlled by a solid state element such as a triac, inverse SCR's, or the like. The circuit is comprised of a phase shift network coupled to the output of the load controller that shifts the phase between the positive and negative half wave for each AC power cycle at a common summing (or nulling) reference point, and a gated switch connected in a load protecting responsive circuit coupled across the AC input line, the gate of the switch being coupled to the summing point. The gated circuit response switch has a threshold voltage at which the gate is triggered, the gated switch being responsive to either a negative or positive threshold charge buildup at the summing point. The gated switch and the response circuit may be coupled to any suitable response device that can effectively either provide an alarm or control the AC input to the load. For example, a thermal link may be activated that acts as a circuit breaker of the AC power input line to the load. Other examples might be the turning on of an alarm or an appropriate signal to an automated computer system which could effectively either switch controllers or shut down the AC power input to the load.

Phase shifting is achieved about the summing point utilizing capacitive-resistive time constant networks, the values of which are selected such that during normal operation of the load controller, the net charge, either positive or negative at the summing point, will be lower than the threshold voltage of the gated switch in the response circuit. The resistive and capacitive values in the phase shifting network are selected such that although the system could be made to operate and respond for a failure of just larger than one cycle, i.e. one half wave failure plus the additional portion of the next cycle, as a practical matter to prevent premature or false firing caused by erratic wave signals for a minimum number of cycles, the device will respond after a predetermined number of cycles have occurred in a half wave condition, either positive or negative.

In a first embodiment, a triac is selected as the example of the semiconductor or solid state control element in conjunction with an AC motor. A sense line is coupled between the triac output and the load to be protected as the input to the present invention. A bi-directional voltage blocking element, such as a diac is coupled along the sense line to a voltage phase shifting network having a common summing point, the network being made up of a pair of resistors and first and second capacitors. One resistor and capacitor in series is coupled from the system reference point to the low side of the input AC power line to the load. The second capacitor is coupled from the reference summing point to the gate of a switch, such as a diac, that is responsive to a threshold voltage of either polarity. A triac acts as the system protection response switch and is connected in series across the AC power input line between the high side and the low side and includes in the circuit a responsive device such as a resistor in thermal communication with a thermal link connected in series with the high AC input line. During normal operation, the accumulated voltage due to phase shifting at the system reference point, will remain below the gate switch trigger voltage (either positive or negative). However, should the load controller triac fail in a half wave condition, (depending upon the circuit values chosen for the capacitors and the resistors in the phase shifting network), after a predetermined number of cycles of half wave failure, (either positive or negative) the summing point voltage buildup, either positive or negative, will exceed the threshold value of the response switch of the circuit causing the gated response switch to close, which heats the resistor in thermal contact with the thermal link. The increased heating will cause the thermal link to open, shutting off the AC input power to the load. Note that although a triac is also used as the system protection response switch which protects the system against the triac load controller failure, the triac will typically fail in a conductive mode, opening the link which is a safe failure.

In an alternate embodiment, circuit element redundancy is employed to increase the reliability of the safety switch in case of a failure of a component in the protection circuit, so that the device fails safe.

The alternate embodiment circuit is comprised of first and second rectifiers, conductive in opposite directions and coupled to sample the output of the control device to the load, first and second capacitors, each coupled to a different rectifier, a third capacitor connected to the first and second capacitors such that the net DC charge of the first and second capacitors acts to charge the third capacitor. A gate controlled heating element circuit is connected across the AC power input and load control element. A thermally responsive circuit breaker such as a thermal fuse is electrically connected in series with the AC power source, the load control, and load, and is mechanically positioned relative to the gated heating element such that whenever the heating element circuit is closed, the circuit breaker will open. The third capacitor is connected to the gate control for the heating element circuit such that a predetermined net voltage on the third capacitor resulting from an asymmetrical power output from the controller triggers the heating element gate circuit, actuating the thermal link, removing AC power from the load and the load control.

In the alternate embodiment, a triac is used as the control element for an inductive load such as an AC motor. The output of the triac that controls the motor is connected to first and second diodes which act as rectifiers that conduct in opposite directions through current limiting resistors, the output of each diode being connected to first and second capacitors of equal capacitance. The third capacitor is then charged by the net per cycle charge of the first and second capacitors. In this embodiment, the third capacitor is connected to a diac that is used to trigger a triac gate that controls a resistor (heating element) circuit connected across the input power line. Whenever a net DC voltage exceeds the diac threshold on the third capacitor, indicative of an asymmetrical per cycle output from the triac that controls the load, the heating element circuit is activated, opening the thermal circuit breaker, disengaging the load and load control triac from the input power. If the AC wave form from the control element to the load is symmetrical (whether full on, full off, or phase-angle fired), the first and second capacitors will have positive and negative voltage levels of equal magnitude such that the net charge at the third capacitor will be essentially zero. If the AC wave form per cycle from the control element to the load is asymmetrical, the voltage levels on the first and second capacitors will not be of equal magnitude, resulting in a net charge upon the third capacitor which triggers the diac thus providing a gate signal to the heating element circuit.

It is an object of this invention to provide a safety protective circuit for use with an AC load or parallel loads and associated solid state control element to prevent damage to the load or loads in the event of an asymmetrical power output caused by either the control or control element.

It is another object of this invention to provide a protective circuit which may be utilized with a triac or silicon-controlled rectifier load control device which can shut down AC power to the load(s) whenever the load control malfunctions in a failure mode which provides an asymmetrical AC (or DC signal) to the load.

It is another object of this invention to provide a protective device which is capable of being remote from physical contact with the load.

And yet, still another object of this invention is to provide a failsafe protective circuit which prevents damage to an AC or inductive load should there be a failure of a control element such that asymmetrical power input is received by the load.

And yet, still another object of this invention is to provide a failsafe protective circuit which will, by deactivation of the load and control in the event of control failure, eliminate any fire or safety hazard which may have resulted from the continued operation of the load on the asymmetrical current output of the solid state control element.

And yet, still another object of this invention is to be capable of sensing more than one phase fault and providing a safe response.

But yet, still another object of this invention is to provide a safety protection circuit to protect an AC inductive or resistive load driven by a controller from a half wave output failure of the controller, the system being greatly reduced in physical size, extremely cost effective, having a low power requirement, useful for multiple sensing operations and which can be utilized for different frequencies of the AC input power.

In accordance with these and other objects which will be apparent hereinafter, the instant invention will now be described with particular reference to the accompanying drawings.

BRIEF DESCRIPTION OF THE DRAWINGS

FIGS. 13a, 13b, and 13c show the voltage waves formed at the reference summing (nulling) point utilized in the instant invention.

PREFERRED EMBODIMENT OF THE INVENTION

Figure 1:
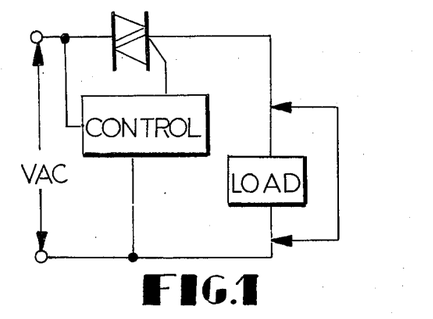
FIG. 1 shows a conventional triac control for an AC load.
Figure 2:
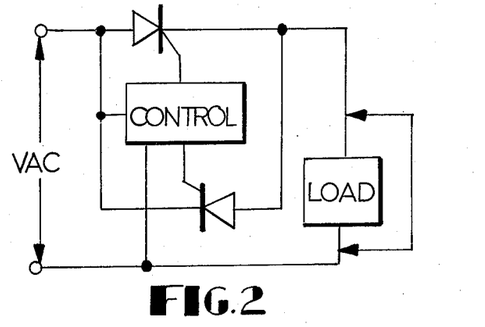
FIG. 2 shows a silicon-controlled rectifier control circuit for use with an AC load.
Figure 3:
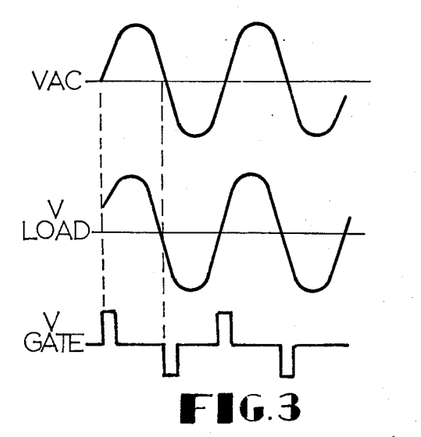
FIG. 3 shows typical output and gate signal waveforms for a triac control device when used with an AC load.
Figure 4:
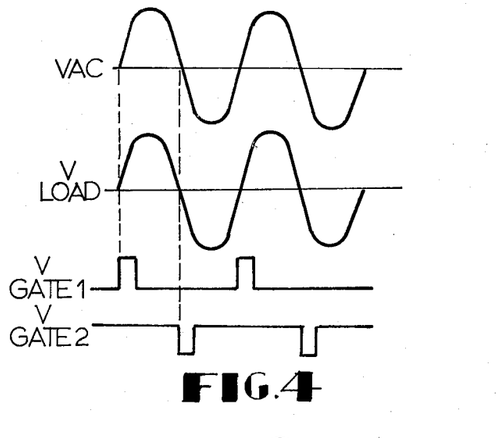
FIG. 4 shows typical output and gate signal waveforms for dual SCR control device when used with an AC load.
Figure 5:
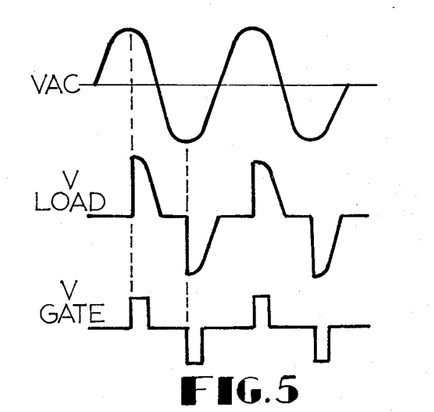
FIG. 5 shows triac output and gate signal waveform patterns using phase control by means of a triac control element for an AC load.
Figure 6:
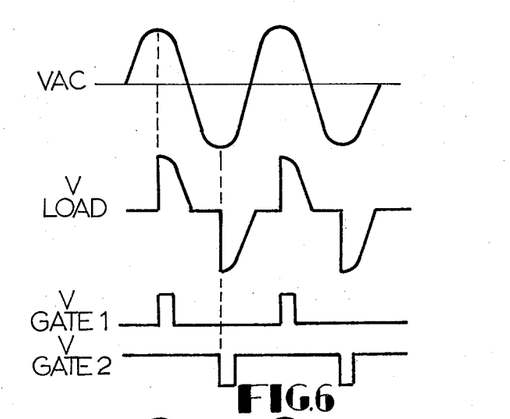
FIG. 6 shows phase control and gate signal wave forms utilizing a dual SCR control element with an AC load.
Figure 7:
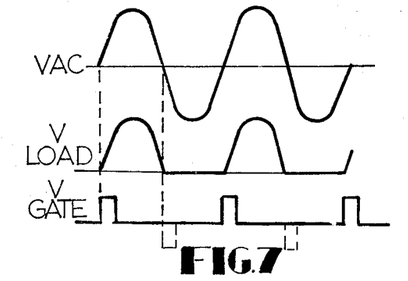
FIG. 7 shows the affect of a missing gate pulse on the output of a triac.
Figure 8:
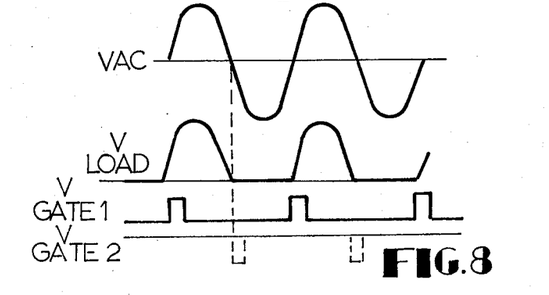
FIG. 8 shows the effect of a missing gate pulse on the output of a dual SCR control element when used with an AC load.

FIG. 1 shows a typical triac circuit used to control an inductive load with an AC input power source connected across the triac and the load. FIG. 2 shows a similar circuit using a pair of silicon-controlled rectifiers SCR1 and SCR2 to control a load having an AC input power source. FIGS. 3 and 4 show on/off gate signals and AC output waveforms for on/off type triac and SCR circuits respectively. FIGS. 5 and 6 show triac and SCR phase control using time-shifted gate signals to produce proportional control of a load and the resultant AC output waveforms.

Figure 9:
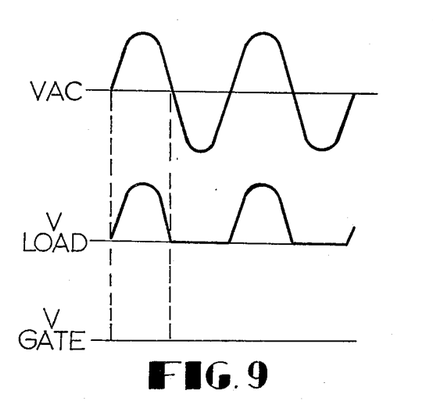
FIG. 9 shows an "uncontrolled diode"-type failure of a triac control element when used with an AC load in either direction.
Figure 10:
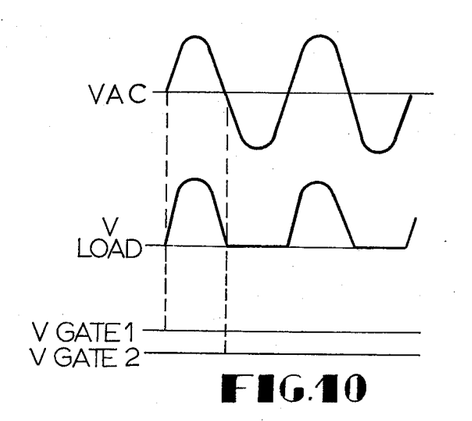
FIG. 10 shows the wave forms of an "uncontrolled diode"-type failure utilizing a dual SCR control device when used with an AC load. This is shown only in the positive direction; however, this may also be negative. Again, this may be of either polarity.
Figure 11:
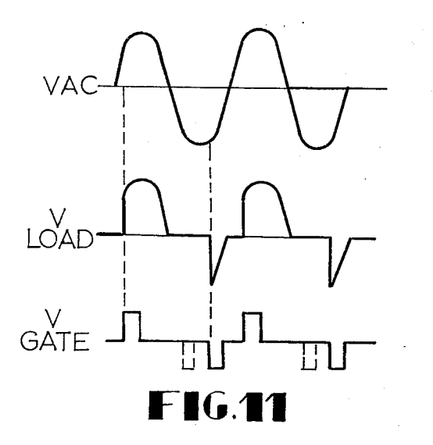
FIG. 11 shows asymmetry of the gate pulse which triggers the triac element used to control an AC load.
Figure 12:
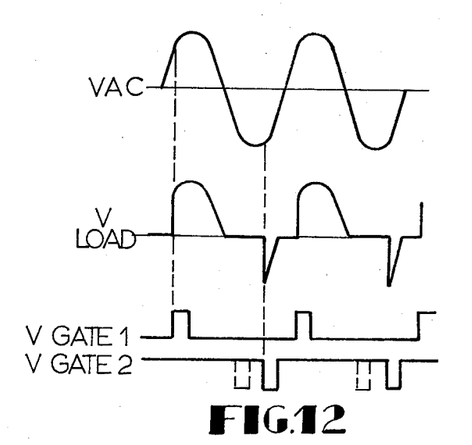
FIG. 12 shows asymmetry of the gate pulse which triggers a dual SCR control element for an AC load.

FIGS. 7, 8, 11, and 12 show asymmetrical waveforms resulting from a failure of the control circuitry used to trigger the triac or dual SCR's of FIGS. 1 and 2. These figures show the asymmetrical waveforms which are experienced by the load and which cause damage to the load. FIGS. 9 and 10 show the affect of an "uncontrolled diode"-type failure of the triac or dual SCR's which would result in DC current being received across the load. This again would result in damage to the load. These conditions when utilizing the protective circuit of the instant invention would pose no problem in that the protective circuit shown for any of these particular failures would cause the AC input power to the load to be disconnected.

If both the positive and negative gate signals fail for either the triac or the dual SCR circuit shown in FIGS. 1 and 2, there will be no control output and, therefore, no hazard. Likewise, should both sides of the triac or both SCR's fail shorted simultaneously, there will be full and continuous symmetrical output from the control element, again resulting in no hazard to the inductive loads. Although resistive heating loads may present a safety hazard if this type of failure occurs, i.e. uncontrolled heating, it is highly unlikely that both halves of the triac or dual SCR circuit would fail simultaneously.

Figure 13A:
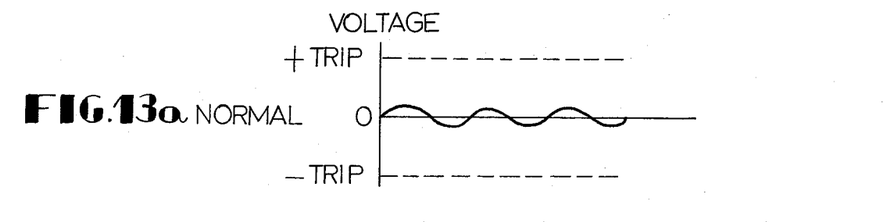
FIG. 13a shows a graphic form of the normal wave form when the load controller is functioning normally.
Figure 13B:
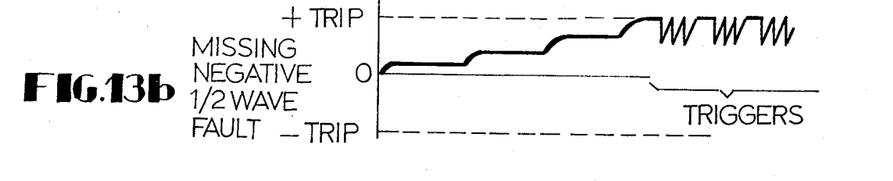
FIG. 13b shows a missing negative half wave fault when the load controller fails in a half wave condition.
Figure 13C:
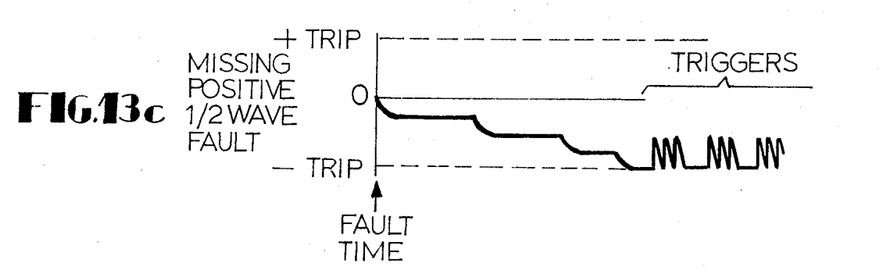
FIG. 13c shows a missing positive half wave fault when the load controller fails.
Figure 14:
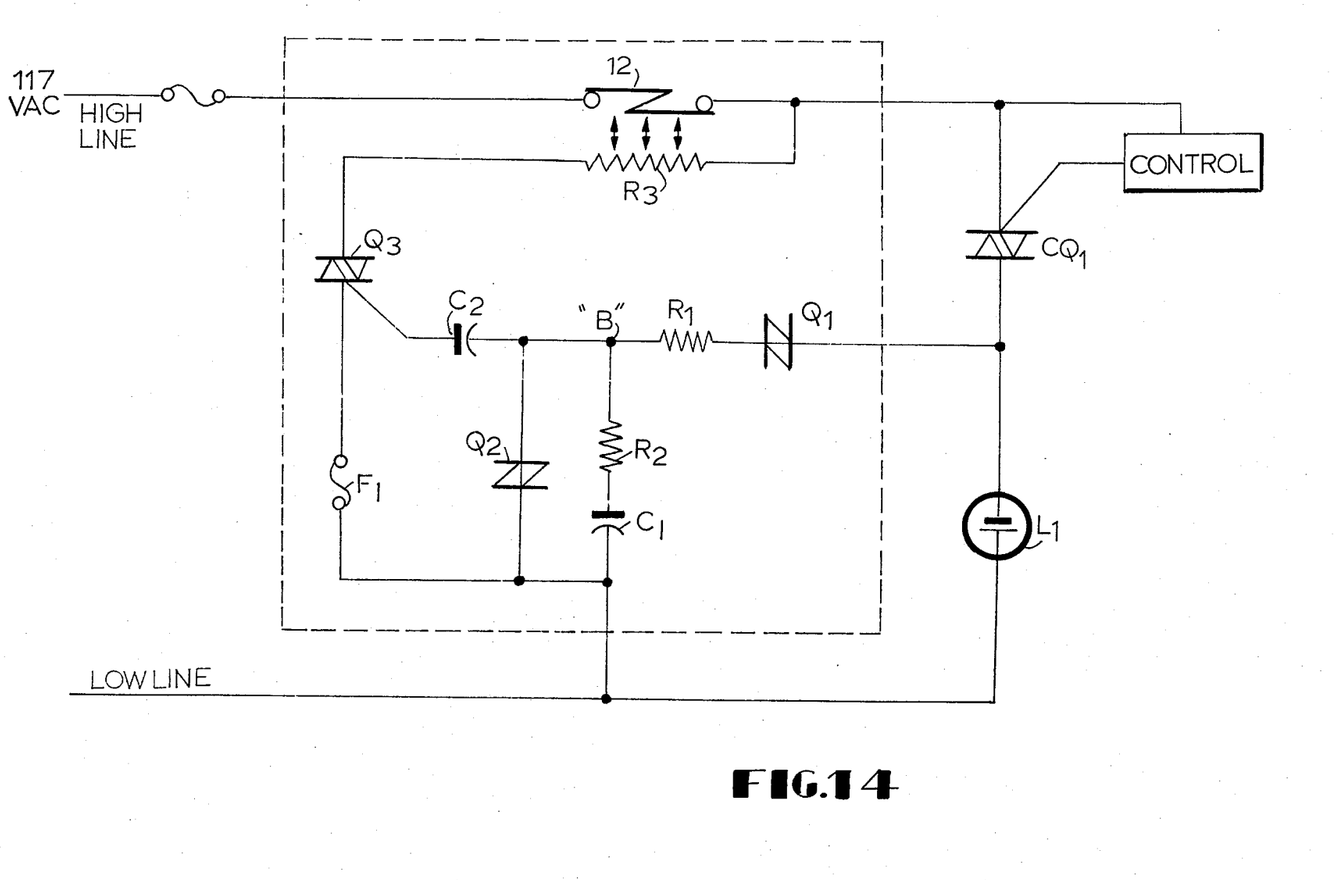
FIG. 14 shows a schematic circuit diagram of one embodiment of the present invention.

Referring now to the drawings and FIG. 14, the first embodiment of the present invention is shown. A triac CQ1 has its output coupled to load L1, such that the triac CQ1 is used to control the load. The triac CQ1 and load L1 are connected across an AC power source by incoming lines as shown. The broken lines encompass the protective safety device embodying the present invention. Essentially a sense line is coupled to the output of triac CQ1 through a voltage blocking diac Q1 coupled to resistor R1. Junction point "B" is the reference summing (or nulling) point used in the present invention. Resistor R2 and capacitor C1 are connected in series from the junction reference point to the low line of the AC input. An additional capacitor C2 is connected from the junction point "B" on one side and to the gate of a triac Q3 which is the load protection response switch used to trigger a safety response if the controller triac Q1 fails in a half wave condition. Capacitor C2 in conjunction with diac Q2 form the trigger network that through the gate of Q3 fires the system response switch Q3 whenever the positive or negative voltage at reference summing point "B" exceeds the threshold value of switch Q2. In this embodiment, the safety response switch Q3 is coupled in series across the AC power input line and includes a safety fuse F1 and a resistor R3 that is in thermal contact with a thermal link 12 connected across the incoming line from the AC power source to the triac controller, CQ1 and load L1. The resistance of R3 is such that upon triggering of switch Q3, line current will heat R3 to the thermal link melting point, causing the link to open which shuts down the AC power to the load. The resistors R1 and R2 and the capacitor C1 and C2 form a phase shifting network such that incoming half waves (positive and negative) which are the output of the triac CQ1 are in effect summed (or nulled) across reference point "B". In normal operation of triac CQ1, the voltage at reference point "B" will be well below the threshold trigger voltage of switch Q2. However, should triac CQ1 fail in a half wave condition, either positive or negative, then (referring to FIGS. 13a, 13b, and 13c) the wave forms are shown and compared such that dependent on the values of elements R1, R2, C1, and C2, after a predetermined number of half wave cycles, the charge build up (either negative or positive) at reference point "B" will be such as to exceed the threshold value of the trigger circuit at C2 and Q2 causing Q3 to fire with the resultant safety response being to shut down the input AC power to the load L1.

Figure 15:
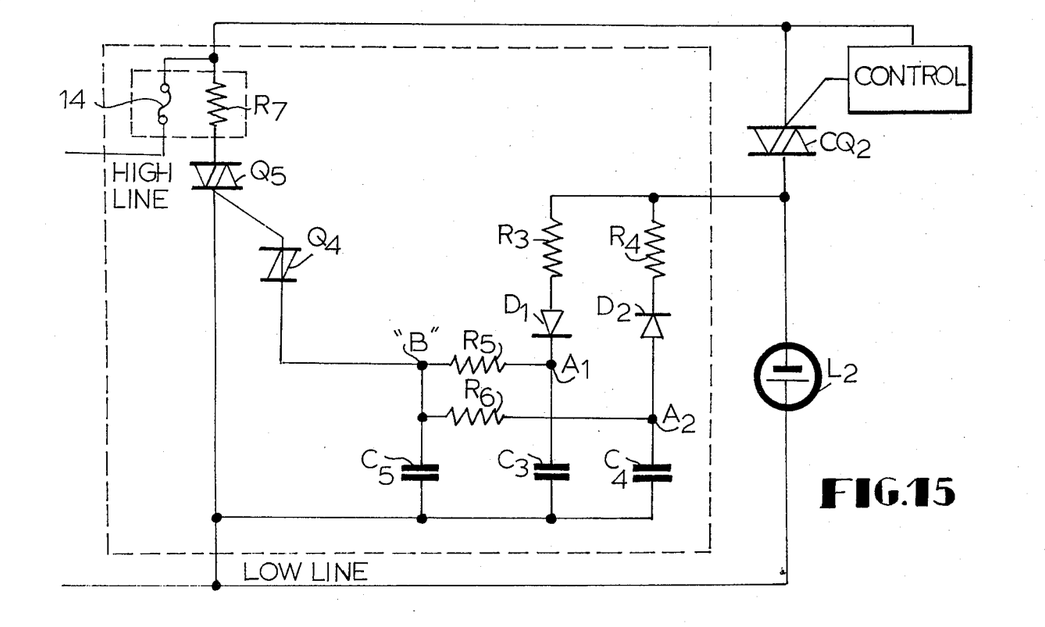
FIG. 15 shows a schematic circuit diagram of an alternate embodiment of the instant invention.

In an alternate embodiment of the invention shown in FIG. 15, circuit redundancy is used to enlarge the overall reliability in the event of a component failure within the safety circuit itself.

The alternate invention is shown in FIG. 15 as a protective circuit connected to an AC power input and a control triac CQ2, which controls the load L2. In normal operation, the triac CQ2 will allow symmetrical full cycle AC power from the AC input line to the load as a function of the triac conductivity. The alternate embodiment protects the load in the event of failure of triac CQ2 in the following manner. A pair of diodes D1 and D2, which are conductive in opposite directions, are connected through current-limiting resistors R3 and R4 to the output of triac CQ2 to allow sampling of the output signal between the triac CQ2 and the load L2. The output of the diodes D1 and D2 are connected to points A1 and A2 respectively and to reference summing point B through resistors R5 and R6. Diodes D1 and D2 outputs are also coupled to a pair of capacitors C3 and C4 respectively which are of equal capacitance such that the positive and negative half cycle power output from the triac CQ2 will be rectified alternately by diodes D1 and D2 causing a charge to be formed on capacitors C3 and C4. The output of each of the capacitors is also connected to reference point B through resistors R5 and R6 and to a third capacitor C5. As long as the output power per full cycle from the triac is symmetrical, the charging on capacitors C3 and C4 will be of equal and opposite magnitude causing a net DC charge at point B of essentially zero. Thus, in this event, capacitor C5 would have no net resultant charge. Point B is connected to diac Q4 having a predetermined DC threshold voltage which in turn acts as a gate for triac Q5. A thermal fuse 14 is connected in series along the "high" input line from the AC power source to control element CQ2. Resistor R7 is positioned physically relative to fuse 14 to be a heating element for fuse 14. Triac Q5 and resistor R7 comprise the heating element circuit across the AC power input line such that whenever triac Q5 is conducting, resistor R7 will heat sufficiently to open fuse 14. Normally, Q5 is off such that no current flows through the resistor R7 such that the thermal fuse 14 will not be opened.

Should an asymmetrical output from the triac CQ2 be sampled through diodes D1 and D2 which results in a net charge from capacitors C3 or C4 (which would charge capacitor C5), when the treshold trigger voltage value of Q4 is exceeded, a gate signal will be received at triac Q5. The gate signal will then cause triac Q5 to conduct, allowing current to flow through resistor R7 causing heating of the thermal fuse 14 resulting in a disconnection of the power from the load. Thus, the circuit acts to protect the load in event of any asymmetrical output from the control triac CQ2.

Because the present invention is designated as a protective circuit, it is important that the circuit be of the highest possible reliability and that failure of the protective circuit have the least possible consequence. The following will describe the potential failure modes of the protective circuit itself and what possible results could occur.

Referring to the schematic diagram of FIG. 15, a failure of either resistor R3 or R4, of diode D1 or D2, of capacitor C3 or C4, or of resistor R5 or R6 would result in a net charge on capacitor C5 leading to an "active failure" which results in shut-down of power to the load. Thus, for the protective circuit to fail in such a mode as to not protect the load, would require a simultaneous failure of two of these particular elements on opposite "sides" of the sensing circuitry which is highly improbable.

A failure of capacitor C5 would cause a failure such that the thermal fuse would not open. This is made highly unlikely, though, by the fact that capacitor C5 has a 500 volt breakdown voltage and, because of the properties of Q4, the voltage applied across C5 cannot exceed 32 volts. Thus, C5 is well protected and stable. The potential failure of diac Q4 is made negligable because of the current limiting properties of resistors R5 and R6 and the relatively low charge rate of capacitors C5. Should the triac Q5 short, this failure would cause the thermal fuse to open rapidly, resulting in an active failure. If only a single side of Q5 opened, it would still allow the diac to fire the remaining side, causing heating of resistor R7 to open the thermal link 14. The possibility of both sides of triac Q5 simultaneously failing open is relatively remote. Thus, the protective circuit embodied in the instant invention is designed to also protect the load (and the user) in the event of a failure of the protective circuit itself.

Representative circuit values are as follows: As to the embodiment shown in FIG. 14, R1, 620 Kohms; R2, 150 Kohms; C1 0.027 microfarads; C2, 0.0068 microfarads, R3, 330 ohms, 1W; diacs Q1 and Q2, model N413M; triac Q3, Q400E3;

As to the embodiment shown in FIG. 15, R3 and R4, 150 Kohms; R5 and R6, 560 Kohms; R7, 1 Kohms; C3 and C4, 0.027 microfarads; C5, 0.0033 microfarads, diodes D1 and D2 are model 1N4004; diac Q4 is model N413M; triac Q5 is model Q400E3.

Figure 16:
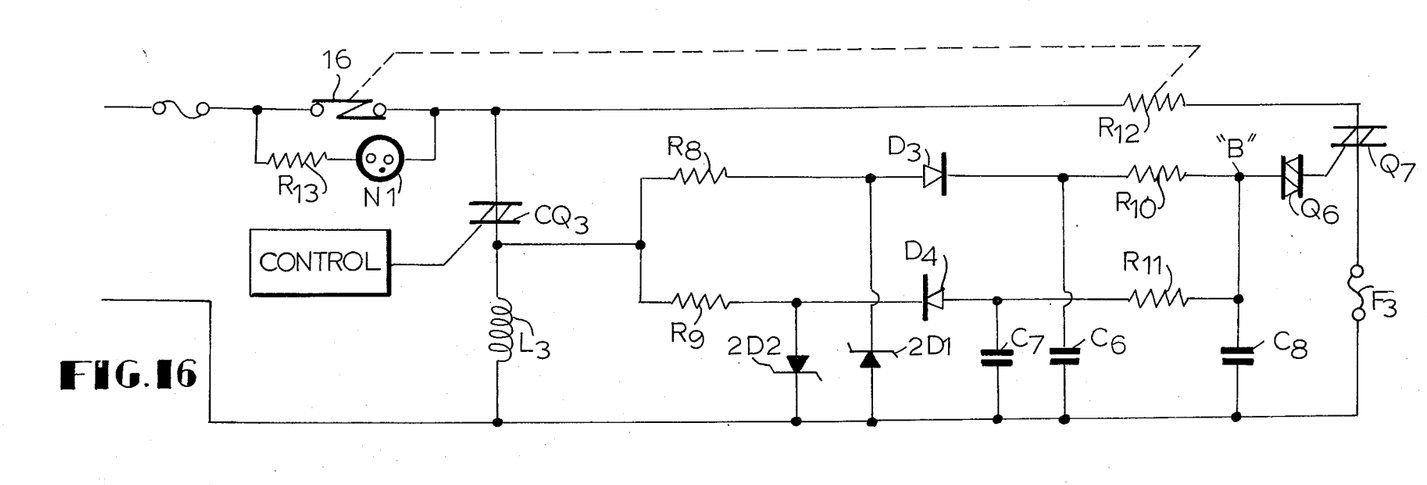
FIGS. 16, 17, 18, and 19 show alternate circuit uses of the present invention.

Referring now to FIG. 16, another embodiment of the circuit is shown which is similar in structure and function to circuits shown in FIG. 15 with the addition of a pair of Zener diodes 2D1 and 2D2, which act through the clipping action of the Zener diodes to extend the voltage window of the device. L3 represents an inductive load controlled by CQ3. The Zener diodes in effect allow the utilization of the present invention such that the present device may be employed with larger voltages.

Figure 17:
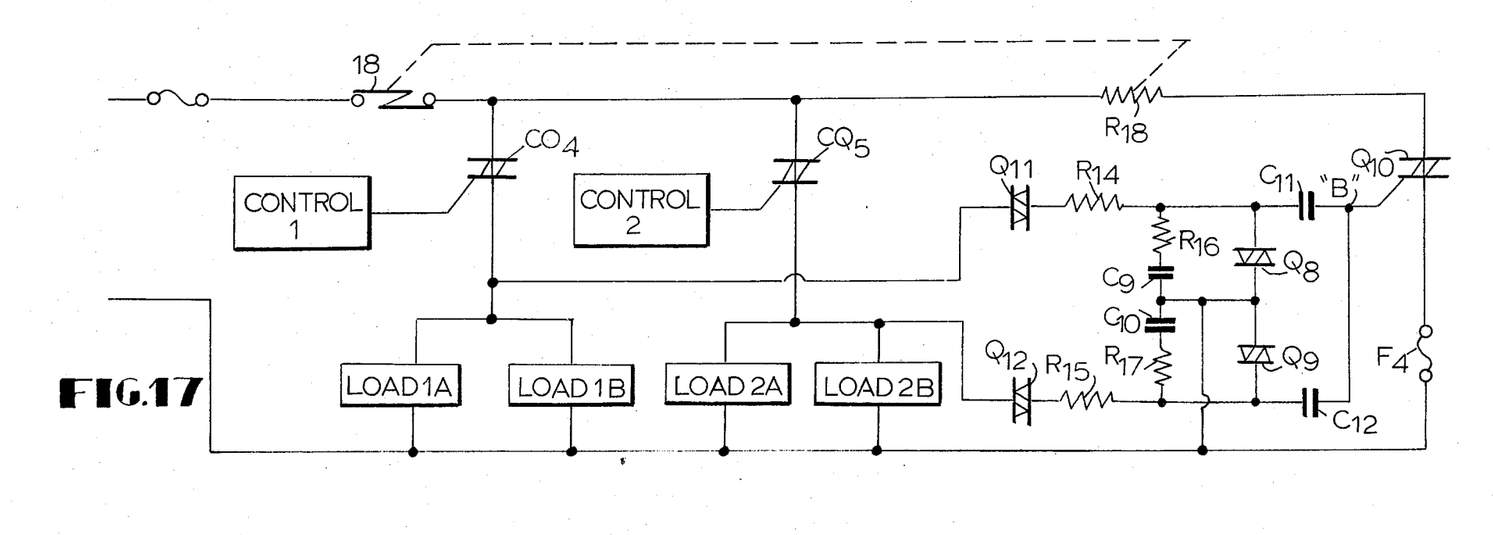

FIG. 17 shows yet another embodiment in which the present safety device can be used to protect a plurality of loads. As shown in FIG. 17, pairs of loads 1A and 1B and loads 2A and 2B are controlled by a pair of controllers Control 1 and Control 2, CQ4 and CQ5 respectfully. The protective circuit, although using a pair of diacs Q8 and Q9, still have a common trigger point "C" that fires Q10 when a net positive or negative charge accumulates at either points "B".

Figure 18:
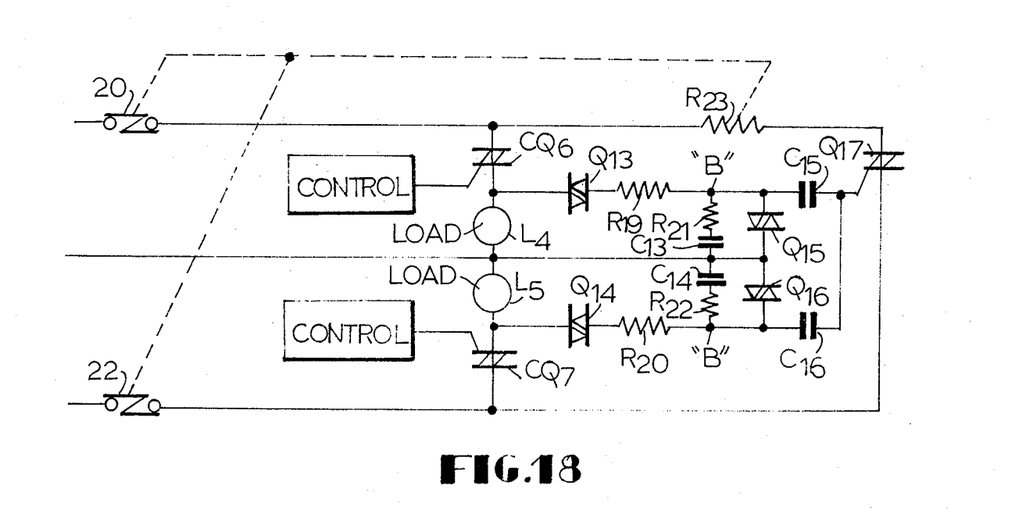

FIG. 18 shows protective safety for a pair of loads L4 and L5 having controllers CQ6 and CQ7 for use on an Edison 220 voltage circuit. The circuit is shown as protected with R23 acting in conjunction with thermal links 20 and 22 which effect shut down of the loads when Q17 is fired, based on a net positive or negative charge at either reference point B.

Figure 19:
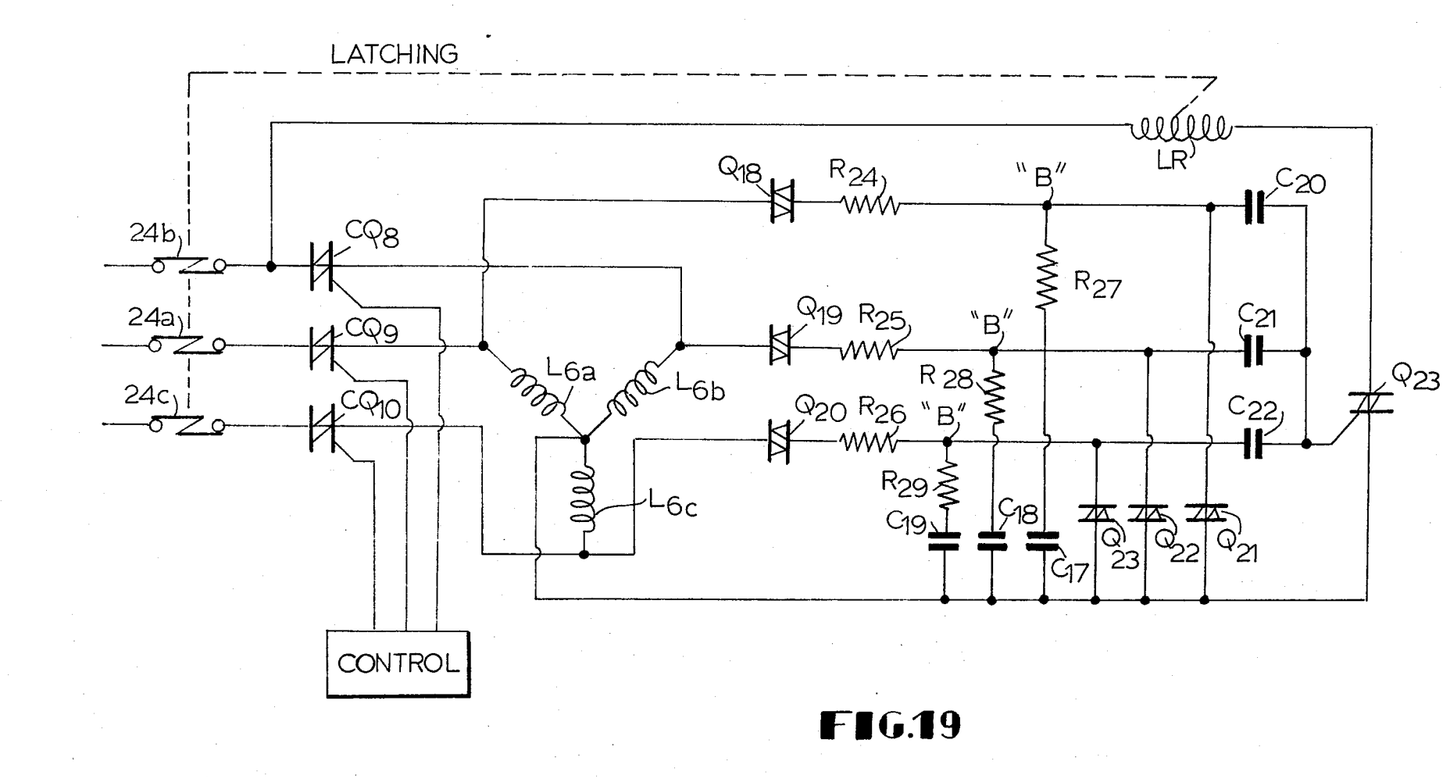

FIG. 19 shows the safety circuit of the present invention employed with a three-phase "Y" load, each phase having separate control CQ8, CQ9, and CQ10 used with a latching relay LR in conjunction with breakers 24a, 24b, and 24c.

In this circuit any phase voltage asymmetry which could harm the system will effect a shut down of the entire load.

In other embodiments, in place of the thermal heater and fuses shown, other circuit elements such as the latching relay shown, a crowbar (standard sort time fuse), the warning buzzer or light could be employed. Also, circuitry such as a diode bridge to provide a signal of single polarity could be used to supply an input to a computer for switching the load controllers.

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. A protective circuit for an AC driven load having a semiconductor load control element coupled to an AC Power source, said protective circuit comprising:
    means for detecting an asymmetrical control element output voltage of either polarity coupled to the output of said load control element, said detecting means including voltage summing point means for summing the positive and negative voltage half wave outputs from the output of said load control element; and
    means responsive to a positive or negative voltage build up above a predetermined amount on said summing point means for providing an indication that the control element output voltage to the load is asymmetrical; and means coupled to said detecting means, responsive to a detected asymmetrical voltage of either polarity for providing an indication that the control element output voltage to the load is asymmetrical.

2. A protective circuit as in claim 1, including: means connected to said responsive means for disconnecting said AC power source from said load whenever an asymmetrical voltage output of said control element is present in said detecting means.

3. A protective circuit as in claim 1, wherein said detecting means includes:
first rectifying means coupled to said load control output and a first capacitor coupled to said first rectifying means;
second rectifying means coupled to said load control output oppositely conductive of said first rectifying means and a second capacitor means connected to said second rectifying means,
a third capacitor, said first and second capacitors being coupled to said third capacitor which receives the net charge from the first and second capacitors whereby a net charge other than zero for more than one full AC cycle is indicative of an asymmetrical AC voltage received from said load control element.

4. A protective circuit for an AC driven load having a semiconductor load control element coupled to an AC Power source, said protective circuit comprising:
means for detecting an asymmetrical control element output voltage of either polarity coupled to the output of said load control element, said detecting means including a null point means for receiving the positive and negative voltage half wave outputs of said load control element; and
a means connected to said null point means responsive to a positive or negative voltage build up above a predetermined amount on said null point means; and
means coupled to said detecting means, responsive to a detected asymmetrical voltage of either polarity for providing an indication that the control element output voltage to the load is asymmetrical.

5. A protective circuit for an AC driven load having a semiconductor load control element coupled to an AC Power source, said protective circuit comprising:
means for detecting an asymmetrical control element output voltage of either polarity coupled to the output of said load control element, said detecting means including means for shifting the phase between the positive half wave voltage output of said control element and the negative half wave voltage output of said control element; and
means connected to the phase shifting means for receiving and summing the positive and negative half wave voltage output; and
means coupled to said detecting means, responsive to a detected asymmetrical voltage of either polarity for providing an indication that the control element output voltage to the load is asymmetrical.

6. A protective circuit as in claim 5, wherein said phase shifting means includes:
capacitor resistive time constant circuit means coupled to the output of said load control element.

* * * * *